United States Patent [19]
Wiese et al.

[11] Patent Number: 5,767,742
[45] Date of Patent: Jun. 16, 1998

[54] CIRCUIT ARRANGEMENT COMPRISING A DIFFERENTIAL AMPLIFIER

[75] Inventors: Peter Wiese, Hamburg; Manfred Biehl, Norderstedt, both of Germany

[73] Assignee: U.S. Philips Corporation, New York, N.Y.

[21] Appl. No.: 715,691

[22] Filed: Sep. 18, 1996

[30] Foreign Application Priority Data

Sep. 20, 1995 [DE] Germany ............ 195 34 873.7

[51] Int. Cl.⁶ ........................................... H03F 3/45
[52] U.S. Cl. .................................. 330/252; 330/258
[58] Field of Search ........................... 330/252, 255, 330/257, 258

[56] References Cited

U.S. PATENT DOCUMENTS 5,254,956  10/1993  Nishijima ................. 330/258
5,293,514  3/1994  Nakagawara ............. 327/65

FOREIGN PATENT DOCUMENTS

0516423A1  12/1992  European Pat. Off. .
0520751A1  12/1992  European Pat. Off. .
92078125   8/1992  Germany .
4210215A1  12/1992  Germany .

*Primary Examiner*—Steven Mottola
*Attorney, Agent, or Firm*—Robert M. McDermott

[57] ABSTRACT

A circuit arrangement includes a differential amplifier having two output terminals for supplying two output signals which each have a signal component which is variable about a reference level and is in phase opposition to the other signal component (push-pull signal). A significant improvement of the common-mode rejection is obtained by means of a control circuit adapted to form a sum signal from the output signals, to form a difference signal from the sum signal and a reference signal, and to control the reference level of the two push-pull signals in dependence upon the difference signal.

1 Claim, 1 Drawing Sheet

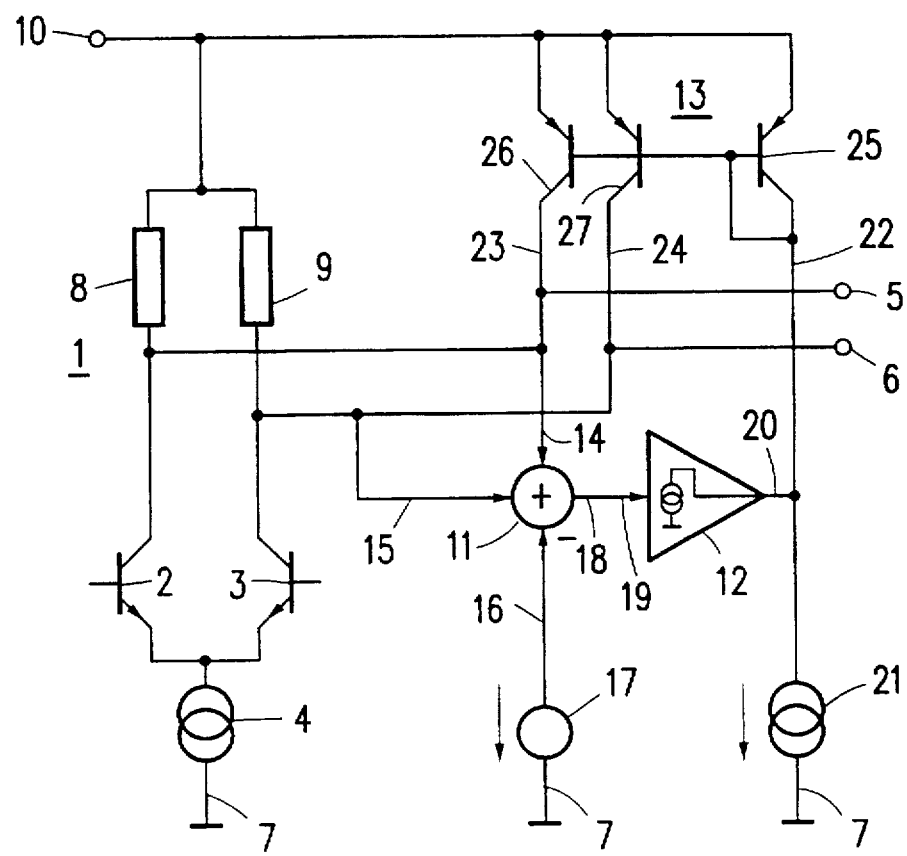

CIRCUIT ARRANGEMENT COMPRISING A DIFFERENTIAL AMPLIFIER

The invention relates to a circuit arrangement comprising a differential amplifier having two output terminals for supplying two output signals which each have a signal component which is variable about a reference level and is in phase opposition to the other signal component (push-pull signal).

Differential amplifiers are preferably used for transmitting and amplifying push-pull signals and at the same time rejecting common-mode signals. In conventional differential amplifiers—also in integrated circuit technique—a high common-mode rejection is achieved by means of optimally identical structures, i.e. characteristics of the components used. This is achieved particularly by a symmetrical construction of the differential amplifier and small distances between its components.

However, it appears that particularly when differential amplifiers are manufactured in integrated circuit technique the attainable production tolerances are not adequate to ensure a high common-mode rejection required for certain uses.

It is an object of the invention to provide a circuit arrangement of the type defined in the opening paragraph, having an improved common-mode rejection.

According to the invention this is achieved in a circuit arrangement of the type defined in the opening paragraph by a control circuit adapted to form a sum signal from the output signals,
to form a difference signal from the sum signal and a reference signal, and
to control the reference level of the two push-pull signals in dependence upon the difference signal.

Owing to the summation of the output signals of the differential amplifier said control circuit only utilizes a common-mode signal contained in the output signal. This sum signal is compared with the reference signal and on the basis of this comparison the reference level is corrected until the common-mode signal is canceled completely. Thus, a significant improvement in common-mode rejection can be achieved in a simple manner.

Advantageous embodiments of the circuit arrangement in accordance with the invention are defined in the subsidiary Claims.

An exemplary embodiment is shown in the FIGURE and will be described in more detail hereinafter.

A differential amplifier 1 is shown and comprises a transistor pair 2, 3 of bipolar transistors, the collector terminals of the bipolar transistors 2 and 3 forming two output terminals 5 and 6, respectively, for supplying two output signals. The emitters of the transistors 2 and 3 are connected to a common supply current source 4, whose other side is connected to ground 7. The transistors 2, 3 thus have their main current paths connected to the supply current source 4. Load resistors 8 and 9 are connected to the collector terminals of the transistors 2 and 3, respectively, the other ends of said load resistors being jointly connected to a supply voltage terminal 10, so that each resistor is arranged in series with each of the main current paths. The nodes between the load resistors 8, 9 and the transistors 2 and 3, respectively, form the output terminals 5 and 6, respectively.

The embodiment shown by way of example in the FIGURE further comprises a control circuit with an adder stage 11, an transconductor stage 12 and a control current transfer circuit 13. The adder stage has a first input 14 connected to the first output terminal 5 of the differential amplifier 1. The adder stage 11 has a second input 15 connected to the second output terminal 6 of the differential amplifier 1 and has a third input 16 coupled to a reference signal source 17, which is also connected to ground 7. This reference signal source preferably supplies a direct voltage as the reference signal. The first and the second input 14, 15 of the adder stage are add inputs and the third input 16 is a subtract input. Thus, in the adder stage the output signals of the differential amplifier 1 are added to the negative value of the reference signal from the reference signal source 17. This results in a difference signal, which is available at an output 18 of the adder stage 11.

In a manner known per se the adder stage 11 may comprise a resistor network. This resistor network may be provided with an operational amplifier to form an analog arithmetic circuit, for example as disclosed in Tietze/Schenk, "Halbleiter-Schaltungstechnik", 8th edition, 1986, pp. 299 ff.

The output 18 of the adder stage 11 is connected to an input 19 of the transconductor stage 12. In the transconductor stage the voltage applied to the input 19 is converted into a proportional current, which is available at an output 20 of the transconductor stage 12. Such transconductor stages are in principle known as controlled current sources, for example as operational amplifiers with current outputs.

The output 20 of the transconductor stage 12, together with one terminal of a constant current source 21 whose other terminal is connected to ground 7, is connected to an input 22 of the control current transfer circuit 13, whose outputs 23 and 24 are connected to the output terminals 5 and 6, respectively. The control current transfer circuit 13 is formed by means of a current mirror arrangement having an input branch comprising a diode-connected pnp transistor 25 connected to the input 22 and an output branch to each of the output terminals 5 and 6 of the differential amplifier 1, which output branches each comprise a pnp transistor 26 and 27, respectively, the pnp transistors 25, 26 and 27 having their base terminals interconnected. The pnp transistor 26 of the output branch to the output terminal 5 is connected to the output 23 of the control current transfer circuit 13 and the pnp transistor 27 of the output branch to the output terminal 6 is connected to the output 24 of this circuit.

In the circuit arrangement described above the output signals of the differential amplifier 1 are thus added in the adder stage and the reference signal from the reference signal source 17 is subtracted from the sum signal thus formed. This results in a difference signal from which the push-pull signals, i.e. the output signal components which vary about the reference level in phase opposition with one another, have been eliminated and which, as a consequence, represents only the common-mode output signal of the differential amplifier 1. This common-mode output signal is converted into a proportional first control current in the transconductor stage 12. Together with the constant current from the constant current source 21, which enables the operating point of the control circuit to be adjusted, the first control current is applied to the current mirror arrangement in the control current transfer circuit 13. The (second and third) control currents derived from the first control current (and the constant current) are then fed into the respective output terminals 5 and 6 of the differential amplifier 1. As a consequence, the division of the current supplied to the transistors 2, 3 by the supply current source 4 between, on the one hand, the load resistors 8 and 9 and, on the other hand, the control current transfer circuit 13 is changed, as a result of which the output potential (reference potential) of the differential amplifier 1 is adapted until the common-mode signal on the output terminals 5, 6 of the differential amplifier 1 has disappeared.

In this way a very great improvement of the common-mode rejection is possible by means of a circuit of simple construction. In a practical case the common-mode rejection of a conventional CI mixer was approximately 36 dB too low. A sinusoidal interference signal on the operating voltage appeared as a common-mode signal on the outputs of the CI mixer. As a result of the inadequate common-mode rejection of the conventional circuit this interference signal was converted into a differential form and transferred as a push-pull interference signal. This affected the operation of the entire system to a considerable extent. With the construction of the circuit arrangement in accordance with the invention the required common-mode rejection of 50 dB is readily attainable in this specific case.

We claim:

1. A circuit arrangement comprising:

a differential amplifier having two output terminals for supplying two output signals which each have a signal component which is variable about a reference level and is in phase opposition to the other signal component (push-pull signal), wherein the differential amplifier comprises:

a pair of transistors having their main current paths connected to one another and to a common supply current source at one end, a respective load resistor in series with each main current path, the nodes between the respective load resistors and the transistors forming the output terminals; and a control circuit adapted to form a sum signal from the output signals, to form a difference signal from the sum signal and a reference signal, and to control the reference level of the two push-pull signals in dependence upon the difference signal, wherein the control circuit comprises:

an adder stage for adding the output signals to a negative value of the reference signal and for supplying the resulting difference signal, a transconductor stage for supplying a first control current corresponding to the difference signal, and a control current transfer circuit for feeding a second and a third control current into a respective output terminal of the differential amplifier, thereby enabling the reference level of the output signals of the differential amplifier to be controlled in accordance with the first control current, wherein the control circuit transfer circuit comprises a current mirror arrangement having an input branch for the first control current and having one output branch for the second control current and one output branch for the third control current.

* * * * *